(12) United States Patent
Mai (10) Patent No.: US 11,064,275 B2
(45) Date of Patent: Jul. 13, 2021

(54) FIXING DEVICE AND AN ELECTRONIC DEVICE WITH THE FIXING DEVICE

(71) Applicant: Yangjun Mai, Guangdong (CN)

(72) Inventor: Yangjun Mai, Guangdong (CN)

( * ) Notice: Subject to any disclaimer, the term of this patent is extended or adjusted under 35 U.S.C. 154(b) by 0 days.

(21) Appl. No.: 16/601,552

(22) Filed: Oct. 14, 2019

(65) Prior Publication Data

US 2021/0076515 A1    Mar. 11, 2021

(30) Foreign Application Priority Data

Sep. 5, 2019 (CN) .......................... 201921477751.7

(51) Int. Cl.
  *H04R 1/02* (2006.01)
  *H05K 5/02* (2006.01)
  *F16B 9/02* (2006.01)

(52) U.S. Cl.
  CPC .............. *H04R 1/026* (2013.01); *F16B 9/02* (2013.01); *H05K 5/0204* (2013.01); *H05K 5/0226* (2013.01)

(58) Field of Classification Search
  CPC .. H04R 1/025; H04R 1/026; H04R 2201/021; F16B 9/02; F21V 21/046; F21V 21/042
  See application file for complete search history.

(56) References Cited

U.S. PATENT DOCUMENTS

| | | | | |
|---|---|---|---|---|
| 5,964,523 A * | 10/1999 | Eversberg | ............... | F21V 21/04 |
| | | | | 362/148 |
| 7,334,767 B2 * | 2/2008 | Wright | .................... | B25B 13/46 |
| | | | | 248/342 |
| 7,570,778 B2 * | 8/2009 | Wright | .................... | H04R 1/025 |
| | | | | 181/150 |
| 7,676,045 B2 * | 3/2010 | Merrey | ................... | H04R 1/025 |
| | | | | 381/87 |
| 7,780,135 B2 * | 8/2010 | Nelson | ................... | H04R 1/025 |
| | | | | 248/342 |
| 8,256,728 B2 * | 9/2012 | Wright | ................... | H04R 1/025 |
| | | | | 248/221.11 |
| 8,445,779 B1 * | 5/2013 | Gretz | ..................... | H02G 3/123 |
| | | | | 174/53 |
| 8,485,487 B2 * | 7/2013 | Cheng | .................... | H04R 1/026 |
| | | | | 248/343 |
| 9,084,046 B2 * | 7/2015 | Ivey | ....................... | H04R 1/025 |
| 9,479,852 B2 * | 10/2016 | Yang | ...................... | H04R 1/026 |
| 9,739,465 B1 * | 8/2017 | Gretz | ...................... | F21S 8/036 |

(Continued)

*Primary Examiner* — Eret C McNichols (57) ABSTRACT

The present invention relates to the technical field of fixing equipment, more specifically, to a fixing device for installing electronic equipment on a plate. The fixing device included a mounting cylinder and a fixing plate arranged around its top of the mounting cylinder; the mounting cylinder and the fixing plate are respectively provided with a number of pairs of clamping assemblies and pressing assemblies, respectively; the fixing device clamps the plate between the fixing plate and the clamping assemblies, thereby installing the electronic equipment on the plate. The fixing device in the present invention can fix the electronic equipment, it only needs to be manually installed in the mounting cylinder and then clamped between the fixing plate and the clamping assemblies, so that the whole process has less manpower participation and simple operation. It is convenient, fast, fixed and stable, and has high practicability.

14 Claims, 7 Drawing Sheets

(56) References Cited

U.S. PATENT DOCUMENTS

| | | | |
|---|---|---|---|
| 10,171,897 B2* | 1/2019 | Hart | H04R 1/025 |
| 10,638,840 B2* | 5/2020 | Moro | A47B 96/06 |
| 10,659,857 B1* | 5/2020 | Hu | H04R 1/025 |
| 10,848,844 B2* | 11/2020 | Brousseau | H04R 1/025 |
| 2003/0012017 A1* | 1/2003 | Reggiani | F21V 21/04 |
| | | | 362/148 |
| 2008/0158862 A1* | 7/2008 | Wu | F21S 8/02 |
| | | | 362/150 |
| 2011/0017889 A1* | 1/2011 | Nelson | H04R 1/026 |
| | | | 248/229.23 |
| 2011/0180678 A1* | 7/2011 | Liu | F21V 21/046 |
| | | | 248/343 |
| 2011/0235342 A1* | 9/2011 | Liang | F21V 21/04 |
| | | | 362/364 |
| 2014/0307445 A1* | 10/2014 | Highbridge | F21V 21/042 |
| | | | 362/296.01 |
| 2018/0058629 A1* | 3/2018 | Hart | E04B 9/006 |
| 2020/0186902 A1* | 6/2020 | Brousseau | H04R 1/025 |

* cited by examiner

FIXING DEVICE AND AN ELECTRONIC DEVICE WITH THE FIXING DEVICE

CROSS-REFERENCE TO RELATED APPLICATIONS

This application claims the benefit of priority from Chinese Patent Application No. CN 201921477751.7, filed on Sep. 5, 2019. The content of the aforementioned application, including any intervening amendments thereto, is incorporated herein by reference in its entirety.

TECHNICAL FIELD

The present invention relates to the technical field of fixing devices, more specifically, to a fixing device for installing electronic equipment on a plate and an electronic device with a fixing device.

BACKGROUND

At present, there are many ways to fix and install electronic devices, such as sound speaker, ceiling horn or lamps. For example, the edge of the electronic device is provided with multiple screw holes, the wall or the wall top is provided with mounting holes, and the electronic device is installed on the wall or the wall top by screws placed in the mounting holes and the screw holes, so as to fix the electronic device, this way needs to manually keep the electronic device being fixed, and then insert the screw into the screw hole and the mounting holes, which consumes a lot of manpower and is extremely troublesome to operate. Or, a hanging structure is used to suspend the electronic device on the wall or the wall in the form of suspension installation. Or, directly stick the electronic device to the wall or the wall top by strong glue. The fixing method for electronic devices such as the like has the problems that the fixing process is inconvenient, the operation is troublesome, and the manpower consumption is large.

SUMMARY

The object of the present invention is to provide a fixing device for installing electronic equipment on a plate, which solves the technical problems of inconvenient fixing of the electronic devices, trouble of operation at fixed time and large manpower consumption in the prior art.

In order to achieve the above object, the present invention provides a fixing device for installing electronic device on a plate. The fixing device includes a mounting cylinder and a fixing plate arranged around the top of the mounting cylinder. The mounting cylinder and the fixing plate are respectively provided with a number of pairs of clamping assemblies and pressing assemblies, respectively. The fixing device clamps the plate between the fixing plate and the clamping assemblies, thereby installing the electronic device on the plate.

The pressing assembly is connected with the fixing assembly in a transmission way. The clamping assembly includes a first shaft and a fan blade pivoted on the first shaft. The plate is clamped between the fixing plate and the top of the fan blade. The pressing assembly pushes or pulls the fan blade to rotate around the first shaft, thereby clamping or releasing the plate.

The clamping assemblies also includes a limiting piece, a first elastic piece, a first pushing piece, and a torsional spring; the limiting piece is arranged on the mounting cylinder, both ends of the first shaft are mounted at the top of the mounting cylinder and on the limiting piece, respectively. The first pushing piece is sleeved on the first shaft. The side, closed to the mounting cylinder, of the fan blade is provided with a second inclined block, and the first pushing piece is connected to the second inclined block. The first elastic piece is arranged on the limiting piece and is elastically contact with the first pushing piece. The torsional spring are set at the top of the first shaft, with one end against the mounting cylinder, the other end against the fan blade.

The pressing assembly includes a second shaft and a second pushing piece. Both ends of the second shaft are movably mounted on the top of the mounting cylinder and on the limiting piece, respectively. The second pushing piece is fixed in the upper part of the second shaft and connected with the first pushing piece. The second shaft is pushed down, and the second pushing piece moves downwards to push the first pushing piece and the fan blade to rotate around the first shaft so that the second inclined block is staggered with the first pushing piece, and the first pushing piece is rose under the action of the first elastic piece and simultaneously drives the fan blade to rotate around the first shaft, so as to open the fan blade.

One end of the second pushing piece is provided with a second connecting portion, and the mounting cylinder is also provided with a limiting slot. The second connecting portion is sleeved on the second shaft, and the second connecting portion is located in the limiting slot. The second connecting portion extends in a direction away from the limiting slot to form a pushing portion, and its side, closed to the fan blade, of the pushing portion is provided with a first inclined plane. The fan blade is provided with a third inclined block in the direction closed to the first inclined plane. The third inclined block is provided with a second inclined plane matched with the first inclined plane.

The first pushing piece is provided with a first inclined block matched with the second inclined block. Its upper end of the first inclined block is provided with a first contacting surface. Its side, away from the mounting cylinder, of the first inclined block is provided with a third inclined plane. Its lower end of the second inclined block is provided with a second contacting surface matched with the first contacting surface. Its side, closed to the mounting cylinder, of the second oblique block is provided with a fourth inclined plane matched with the third inclined plane.

The pressing assemblies also include a third pushing block fixedly sleeved on the second shaft. The second shaft is pulled upward to drive the third pushing block to move upward, then the second shaft is rotated to the third pushing block above the first pushing piece, the second shaft is pushed downward, so as to the third pushing block push the first pushing piece downward until the fan blade flips around the first shaft to the first pushing piece against the second inclined block.

The fan blade includes a clamping block and fan leaves, the fan leaves are fixed with the clamping block. The side of the clamping block is provided with a first connecting portion, and the first connecting portion is rotatively connected to the first shaft. Both ends of the fan leaves are provided with a first sleeved block and a second sleeved block, respectively, which are sleeved on both ends of the first shaft, respectively.

The upper portion of the mounting cylinder is also provided with an inner groove, and the first sleeved block and the second sleeved block are accommodated in the inner groove. After the fan blade is flipped, a clamping space is formed between its top end of the fan blade and the fixing plate, thereby clamping the plate.

One or more of the above technical proposals in the fixing device in the present invention has at least one of the following technical effects: the fixing device in the present invention includes the mounting cylinder, the fixing plate, and a number of pairs of matching clamping assemblies and pressing assemblies, so that when the electronic device is needed to fix, the electronic device only needs to be manually installed in the mounting cylinder, then clamped between the fixing plate and the clamping assemblies. The whole process needs less manpower participation and is simple, It is convenient, fast, fixed and stable, and has high practicability.

The invention also provides an electronic device with the fixing device. Used the fixing device, the electronic device has the advantages of less labor participation, simple operation, convenience and quickness, stable fixation and high practicability when the electronic device is fixed.

BRIEF DESCRIPTION OF THE DRAWINGS

In order to more clearly explain the technical proposals in the embodiment of the present invention, the following will briefly introduce the figures that need to be used in the embodiment or the prior art description. It is obvious that the figures is in the following description are only some embodiments of the present invention, and for the ordinary technical personnel in the field, other figures can be obtained according to these figures without paying creative labor.

DETAILED DESCRIPTION OF EMBODIMENTS

Embodiments of the present invention are described in detail below, and an example of the embodiment is shown in the attached drawings, in which the same or similar label represents the same or similar element or element with the same or similar function. The embodiments described below by reference to the attached drawings are exemplary and are intended to explain embodiments of the present invention and cannot be understood as restrictions in the present invention.

In the description of the embodiments of the present invention, it is important to understand that the azimuth or position relationships indicated by the terms "length", "width", "upper", "lower", "front", "rear", "left", "right", "vertical", "horizontal", "top", "bottom", "inside", "outside", etc., are based on the azimuth or position relationship shown in the attached figure only to facilitate the description and simplification of the embodiment of the invention. Instead of indicating or implying that the device or element must have a specific azimuth, constructed and operated in a specific azimuth, it cannot be understood as a limitation on the present invention.

In addition, the terms "the first", "the second" are for descriptive purposes only and are not to be construed as indicating or implying a relative importance or implicitly indicating the number of technical features indicated. Thus, the characteristics of "the first" and the "the second" are defined, which may include one or more of the features either explicitly or implicitly. In the description of embodiments of the invention, the "multiple" has the meaning of two or more, unless specifically defined otherwise.

In the embodiment of the invention, unless otherwise specified and limited, the terms "install", "connect", "fix" and other terms should be understood in a broad sense, for example, it can be a fixed connection, a detachable connection, or a whole, which can be a mechanical connection or an electric connection. It can be directly connected or indirectly connected by intermediate medium, which can be the internal connection of two components or the interaction between two components. For ordinary technical personnel in the field, the specific meaning of the above terms in embodiments of the present invention can be understood according to the specific circumstances.

Figure 1:
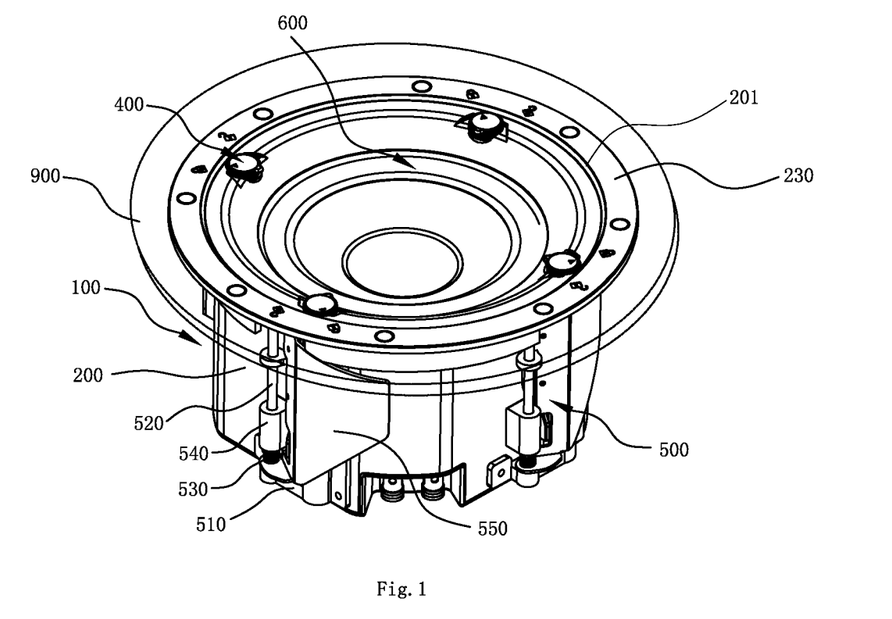
FIG. 1 is a perspective view of the fixing device in closed state in the present invention.

Referring to FIG. 1, the present invention provides a fixing device 100 for installing an electronic device 600 on a plate 900. The fixing device 100 includes a mounting cylinder 200 and a fixing plate 230 arranged around its top 201 of the mounting cylinder 200. The electronic device 600 is fixedly mounted in the mounting cylinder 200. The mounting cylinder 200 and the fixing plate 230 are provided with a plurality of pairs of clamping assemblies 500 and pressing assemblies 400. The fixing device 100 clamps the plate 900 between the fixing plate 230 and the clamping assemblies 500, thereby installing the electronic device 600 on the plate 900.

Figure 2:
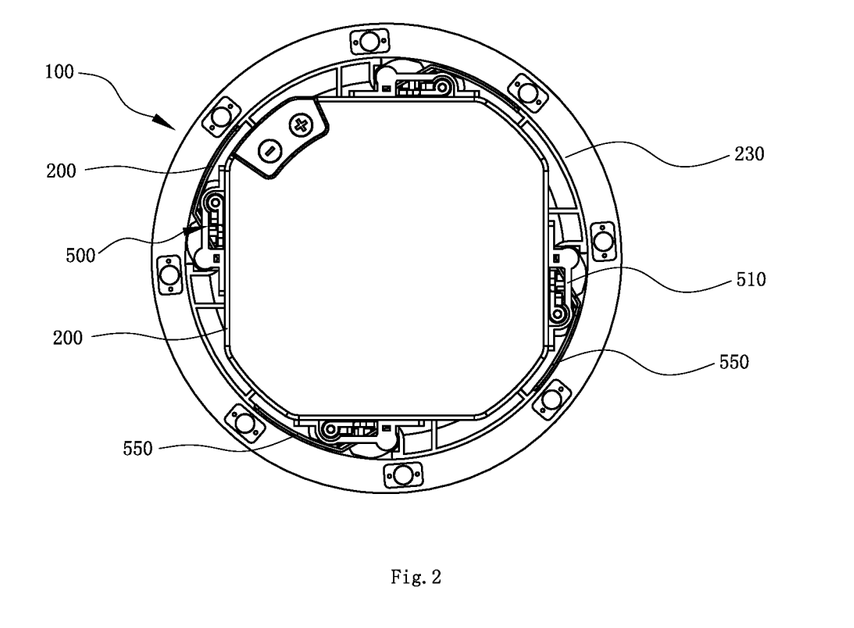
FIG. 2 is a bottom view of FIG. 1.
Figure 3:
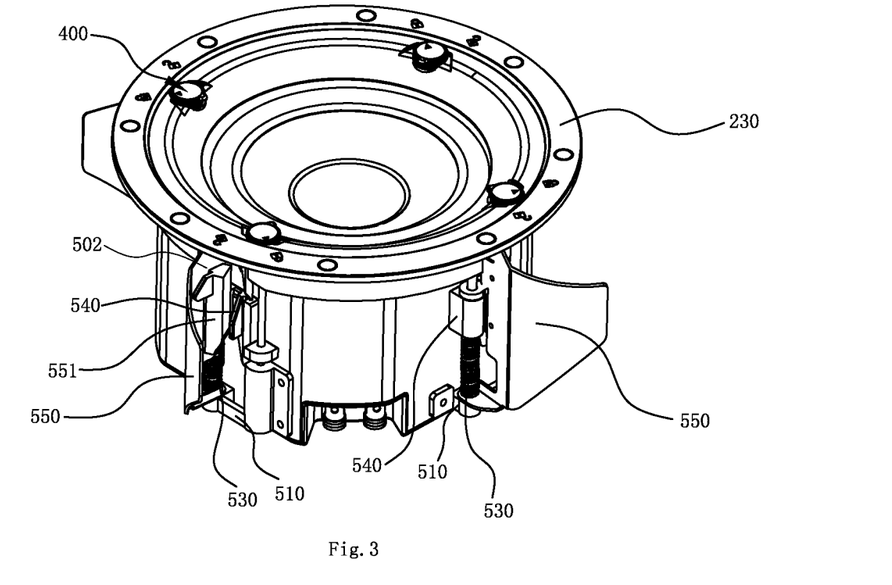
FIG. 3 is a perspective view of the fixing device in opened state in the present invention.
Figure 4:
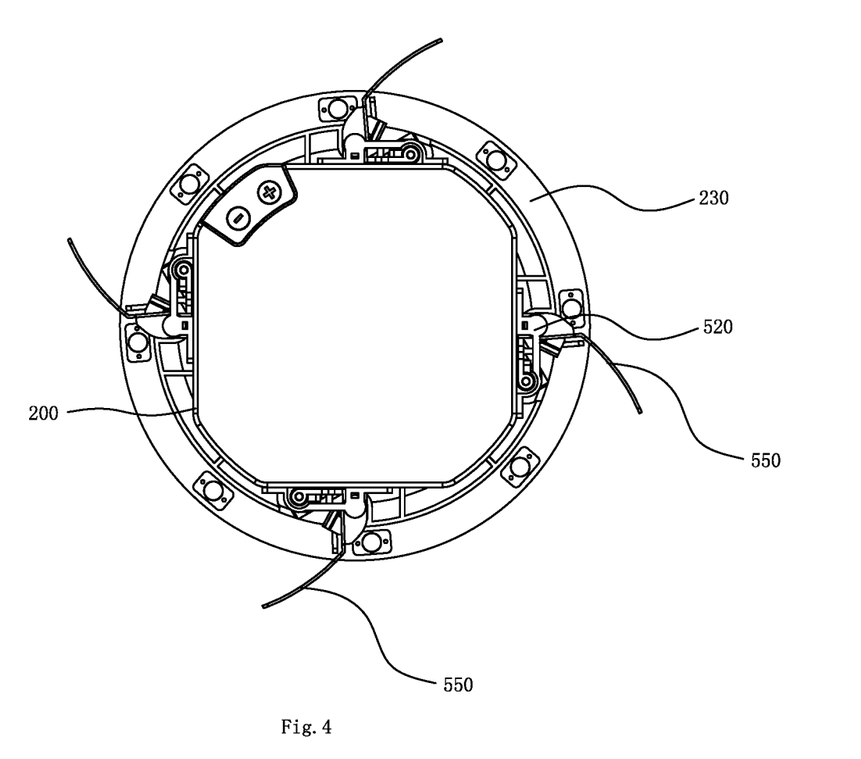
FIG. 4 is a bottom view of FIG. 3.

Referring to FIG. 1, FIG. 2 and FIG. 3, each of the pressing assemblies 400 is connected with each of the clamping assemblies 500 in a transmission way. Each of the clamping assemblies 500 includes a first shaft 520 and a fan blade 550 pivoted on the first shaft 520. The plate 900 is clamped between the fixing plate 230 and the top 501 of the fan blade 550. Each of the pressing assemblies 400 pushes or pulls the fan blade 550 to rotate around the first shaft 520, thereby clamping or releasing the plate 900.

Referring to FIG. 1 and FIG. 4, FIG. 5, FIG. 8, each of the clamping assemblies 500 also includes a limiting piece 510, a first elastic piece 530, a first pushing piece 540, and a torsional spring 560. The limiting piece 510 is arranged on the mounting cylinder 200. Both ends of the shaft 520 are mounted at the top 201 of the mounting cylinder 200 and on the limiting piece 510, respectively. The first pushing piece 540 is sleeved on the first shaft 520. Its side 502, closed to the mounting cylinder 200, of the fan blade 550 is provided with a second inclined block 551, and the second inclined block 551 can contact and press the first pushing piece 540. The first elastic piece 530 is arranged on the limiting piece 510 and is elastically contact with the first pushing piece 540. It should be understood that the first elastic piece 530 may be a variety of elastic elements, preferably a spring. The first pushing piece 540 can rise along the first shaft 520 under the action of the first elastic piece 530. When the second inclined block 551 contacts and presses the first pushing piece 540, the first elastic piece 530 is in pressed state.

The torsional spring 560 are arranged at the top 521 of the first shaft 520, with one end 561 of the torsional spring 560 against the mounting cylinder 200, the other end 562 of the torsional spring 560 against the fan blade 550.

Figure 5:
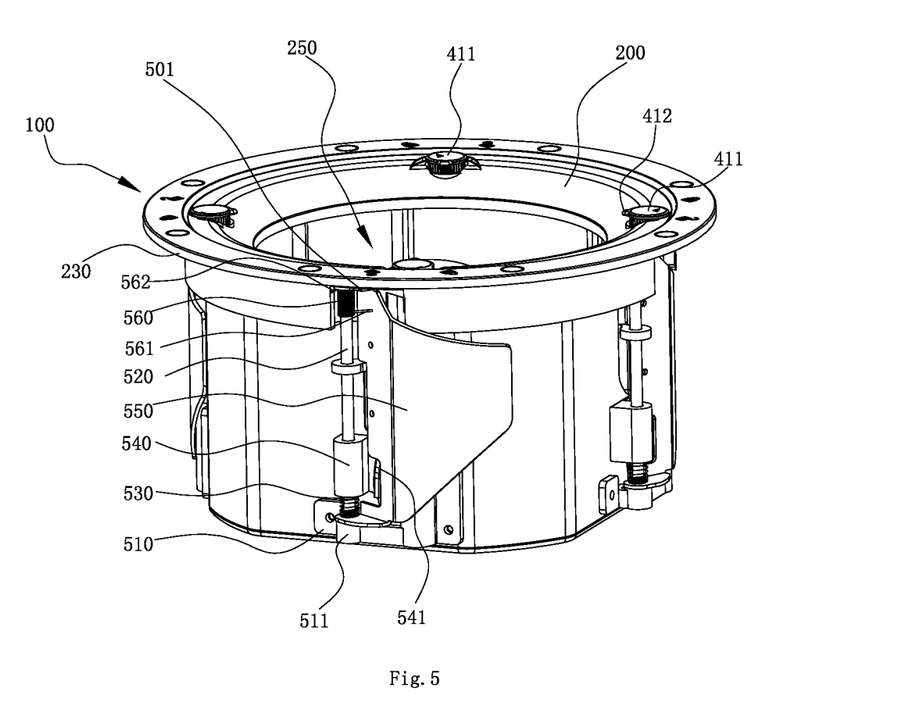
FIG. 5 is another perspective view of the fixing device in closed state in the present invention.
Figure 6:
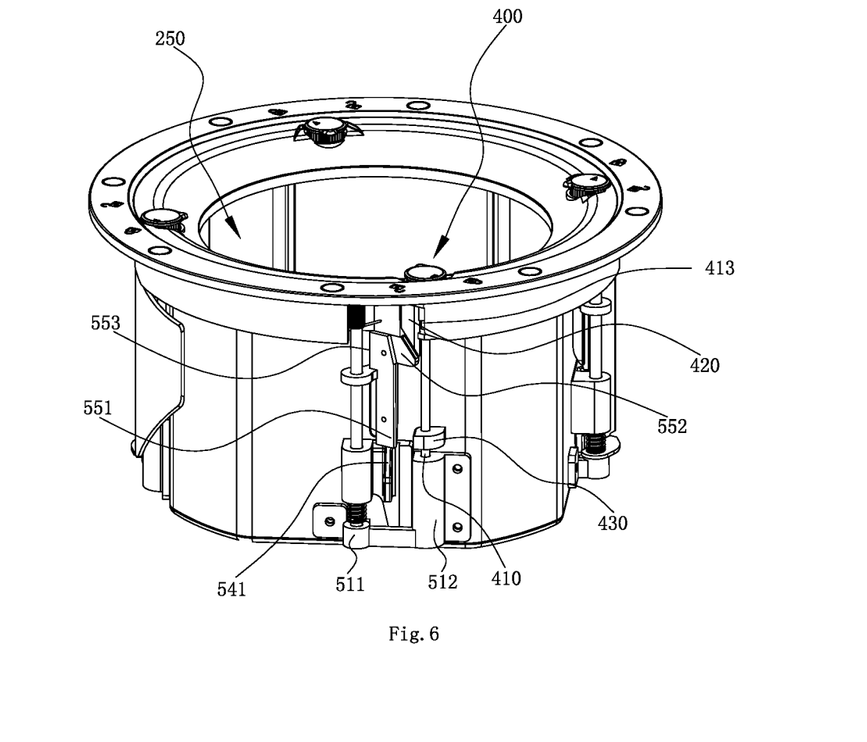
FIG. 6 is another perspective view of the fixing device removing the fan blade in FIG. 5.
Figure 7:
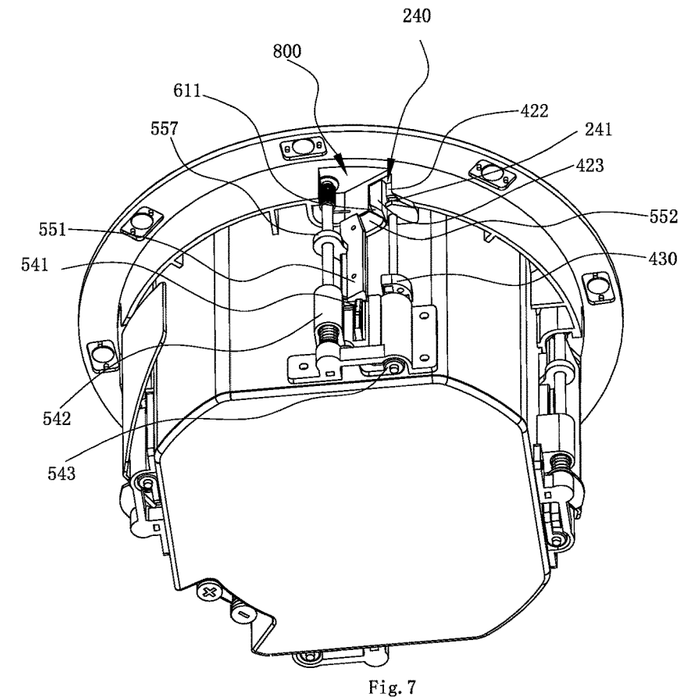
FIG. 7 is another perspective view of FIG. 6.

Referring to FIG. 5, FIG. 6 and FIG. 7, each of the pressing assemblies 400 includes a second shaft 410 and a second pushing piece 420. Both ends of the second shaft 410 are movably mounted on the top 201 of the mounting cylinder 200 and on the limiting piece 510, respectively. The second pushing piece 420 is fixed at its upper part 413 of the second shaft 410 and contacts with the second inclined block 551. The second shaft 410 is pressed down by manpower, the second pushing piece 420 is moved downwards to push the second inclined block 551, thus the fan blade 550 is rotated around the first shaft 520 with the second inclined block 551 so that the second inclined block 551 is staggered with the first pushing piece 540. When the second inclined block 551 doesn't contact and press the first pushing piece 540, the first pushing piece 540 is rose along the first shaft 520 under the action of the first elastic piece 530 and simultaneously drives the fan blade 550 to rotate around the first shaft 520 again, so as to open the fan blade 550. The fan blade 550 in opened state can be seen in FIG. 3 and FIG. 4.

Figure 8:
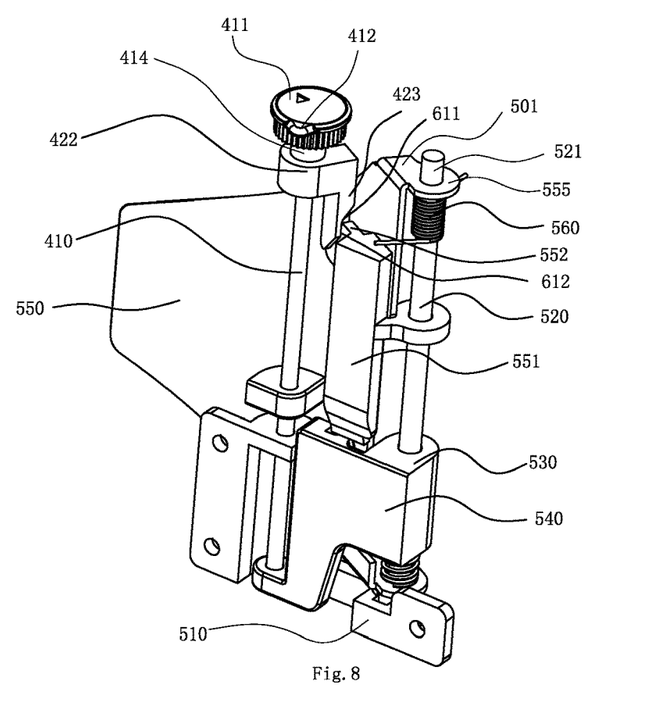
FIG. 8 is another perspective view of the fixing device removing the fan blade in FIG. 1.
Figure 9:
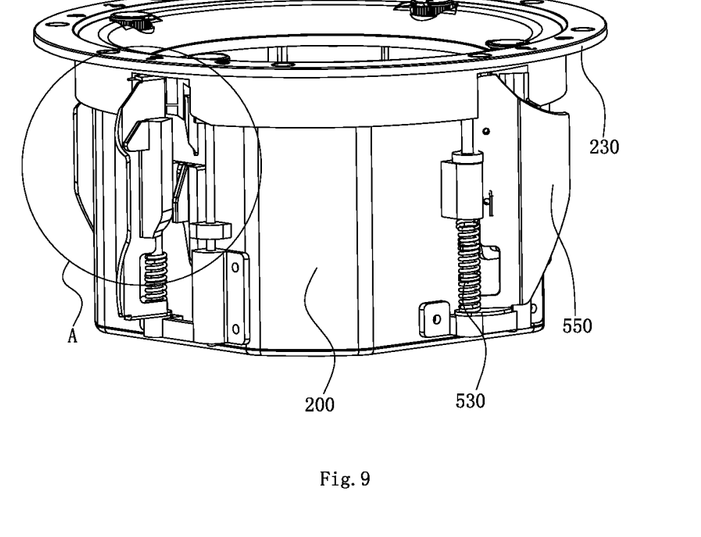
FIG. 9 is another perspective view of the fixing device in opened state in the present invention.

Referring to FIG. 6, FIG. 7 and FIG. 8, one end of the second pushing piece 420 is provided with a second connecting portion 422, and the mounting cylinder 200 is also provided with a limiting slot 240. The second connecting portion 422 is sleeved on the second shaft 410, and the second connecting portion 422 is located in the limiting slot 240. The second connecting portion 422 extends in a direction away from the limiting slot 240 to form a pushing portion 423, and its side, closed to the fan blade 550, of the pushing portion 423 is provided with a first inclined plane 611. The fan blade 550 is provided with a third inclined block 552 in the direction closed to the first inclined plane 611. The third inclined block 552 is provided with a second inclined plane 612 matched with the first inclined plane 611. The second shaft 410 is pushed down, and the second pushing piece 420 moves downward so that the first inclined plane 611 of the pushing portion 423 is pushed against the second inclined plane 612 of the third inclined block 552, thereby staggering the second inclined block 551 and the first pushing piece 540.

In particular, the limiting slot 240 is used to limit the moving space of the second pushing piece 420. When the second shaft 410 is pushed down to the second connecting portion 422 in contact with the bottom 241 of the limiting slot 240, the first inclined plane 611 of the pushing portion 423 pushes the second inclined plane 612 of the third inclined block 552, thereby the first pushing piece 540 is no longer in contact with the second inclined block 551.

Referring to FIG. 5 and FIG. 8, the top 414 of the second shaft 410 is provided with a pressing head 411, and the pressing head 411 is provided with a hand dial head 412. The pressing head 411 is used for pushing the second shaft 410 downward. And the hand dial head 412 is used for pulling the second shaft 410 upward.

Figure 10:
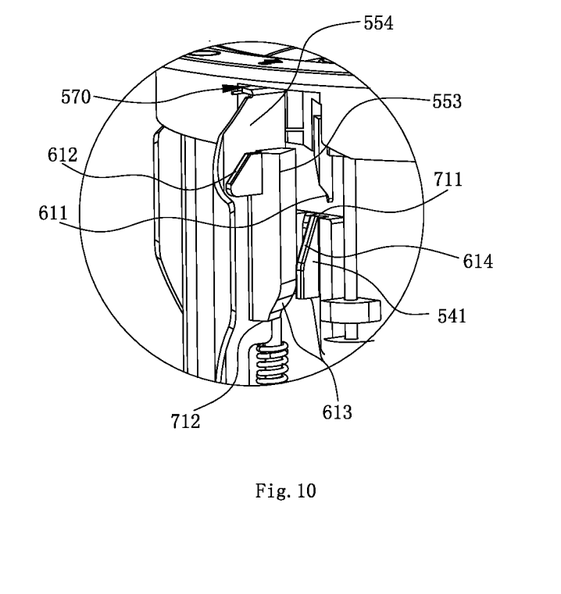
FIG. 10 is an enlarged view at A in FIG. 9.

Referring to FIG. 10, the first pushing piece 540 is provided with a first inclined block 541 matched with the second inclined block 551. Its upper end of the first inclined block 541 is provided with a first contacting surface 711. Its side, away from the mounting cylinder 200, of the first inclined block 541 is provided with a third inclined plane 613. Its lower end of the second inclined block 551 is provided with a second contacting surface 712 matched with the first contacting surface 711. Its side, closed to the mounting cylinder 200, of the second inclined block 551 is provided with a fourth inclined plane 614 matched with the third inclined plane 613. When the fixing device 100 is in a closed state, as shown in FIG. 1 and FIG. 2, the first contacting surface 711 is connected with the second contacting surface 712. It should be understood that when the second inclined block 551 is staggered with the first pushing piece 540, the first contacting surface 711 and the second contacting surface 712 are no longer contacted. At this time, under the elastic action of the first elastic piece 530, the fourth inclined plane 614 is pushed against the third inclined plane 613 until the fan blade 550 is rotated.

Referring to FIG. 7, each of the pressing assemblies 400 also includes a third pushing block 430 fixedly sleeved on the second shaft 410. The third pushing block 430 is used in conjunction with the second shaft 410 to reset the fan blade 550 so that the fixing device 100 is reset to a closed state. The processes of resetting the fan blade 550 are as follows: First, the pressing head 411 is pulled up by manpower so that the second shaft 410 and the third pushing block 430 is moved upward simultaneously. Next, the pressing head 411 is rotated by manpower so that the second shaft 410 and the third pushing block 430 is rotate simultaneously until a portion of the third pushing block 430 is located above the first pushing piece 540. Then, the pressing head 411 is pressed downward so that the third pushing block 430 pushes the first pushing piece 540 down along the first shaft 520.

When the pressing head 411 is pressed, the pressure applied to the pressing head 411 is greater than the elastic force of the first elastic piece 530, and the pressure is transmitted to the first pushing piece 540 through the third pushing block 430 so that the first pushing piece 540 moves downward along the first shaft 520, and the first elastic piece 530 is compressed. At the same time, the torsional spring 560 is gradually reset, and the fan blade 550 is rotated around the first shaft 520 in a direction close to the second shaft 410 until the upper surface of the first pushing piece 540 is connected with the lower surface of the second pushing piece 420. At this time, the fan blade 550 is reset and the fixing device 100 is in a closed state. Further, in this embodiment, the shape of the third pushing block 430 is ¼ quarter circle. Thus, with the co-operation of the third pushing block 430 and the second shaft 410, the fan blade 550 can be reset with only a small amount of manpower, so as to remove the fixing device 100 from the mounting hole of the plate 900. It not only saves labor, quickly, conveniently and quickly fixed the electronic equipment, but also realizes the efficient and convenient removal of the electronic equipment, which has high practicability.

Referring to FIG. 5 and FIG. 6, one side of the limiting member 510 is provided with a shaft fixing portion 511. The other side of the limiting member 510 is also provided with a first limiting portion 512, one side of the first shaft 520 is fixedly connected with the shaft fixing portion 511, and the first limiting portion 512 is packaged with a guiding block 542. The first limiting portion 512 defines the motion space of the guiding block 542, and the first elastic piece 530 is guaranteed to have greater elasticity within the finite displacement of the guiding block 542, so that when the fixing device 100 is in a closed state, the clamping assemblies 500 are steadily pushed and the stability of the fixing device 100 in a closed state is improved.

Figure 11:
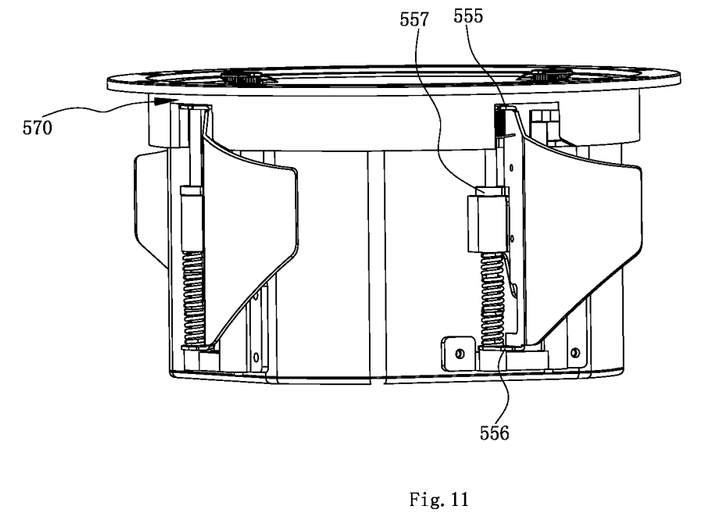
FIG. 11 is a side view of the fixing device in the present invention.

Referring to FIG. 10 and FIG. 11, the fan blade 550 includes a clamping block 553 and fan leaves 554, the fan leaves 554 are fixed with the clamping block 553. The side of the clamping block 553 is provided with a first connecting portion 557, and the first connecting portion 557 is rotatively connected to the first shaft 520. Both ends of the fan leaves 554 are provided with a first sleeved block 555 and a second sleeved block 556, respectively, which are sleeved on both ends of the first shaft 520, respectively. The fan leaves 554 and the clamping block 553 may be screwed, clamped, bonded or otherwise made to achieve a fixed connection, and the invention is not specifically limited. Further, with the first sleeved block 555 and the second sleeved block 556, the fan blade 550 is stably connected with the first shaft 520, which promises that the fan blade 550 is rotated around the first shaft 520.

Referring to FIG. 7, the upper portion of the mounting cylinder 200 is also provided with an inner groove 800, and the first sleeved block 555 are accommodated in the inner groove 800. After the fan blade 550 is rotated, a clamping space 570 is formed between its top end of the fan blade 550 and the fixing plate 230, thereby clamping the plate at the clamping space 570.

The working principle of the fixing device 100 according to the present invention is further described below:

The electronic device is firstly installed in the mounting cylinder 200. The fixing device 100 is in a closed state, and the second contacting surface 712 of the second inclined block 551 is contacted with the first contacting surface 711 of the first inclined block 541. The first elastic piece 530 is in a compressed state, and the resilient force of the first elastic piece 530 is continuously transmitted to the first pushing piece 540, so that the first contacting surface 711 of the first inclined block 541 is closely contacted with the second contacting surface 712 of the second inclined block 551. The torsion spring 560 is in the diastolic state, that is, one end of the torsion spring 560 has an elastic force on the fixing fan leaves 550. The elastic force also ensures that a certain contact area is always present between the first contacting surface 711 of the first inclined block 541 and the second contacting surface 712 of the second inclined block 551. Thus, on the one hand, the second inclined block 551 is always pushed by the first inclined block 541, on the other hand, the fan blade 550 is also pushed by the torsional spring 560, thereby ensuring that the fan blade 550 is in a stable and static state at this time.

Figure 13:
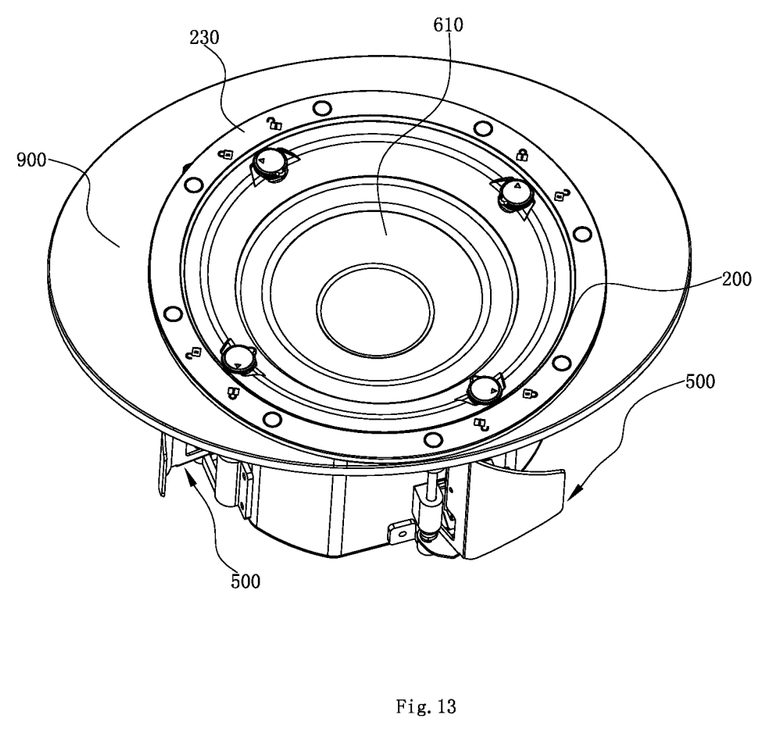
FIG. 13 is a view of the fixing device installed an electronic device on a plate in the present invention.

Referring to FIG. 13, the fixing plate 230 of the mounting cylinder 200 is connected to the plate 900. The pressing head 411 is pressed, and the second pushing piece 420 is driven by the second shaft 410 to push the fan blade 550 until the second contacting surface 712 of the second inclined block 551 is no longer contacted with the first contacting surface 711 of the first inclined block 541. Next, the first elastic piece 530 pushes the first pushing piece 540 upward so that the first inclined block 541 is pushed upward against the second inclined block 551 along the first rotating shaft 520 until the fan blade 550 is rotated to form the clamping space 570, and the clamping space 570 holds the plate 900. It has the advantages of simple operation, convenient, fast, fixed and stable, and high practicability.

Figure 12:
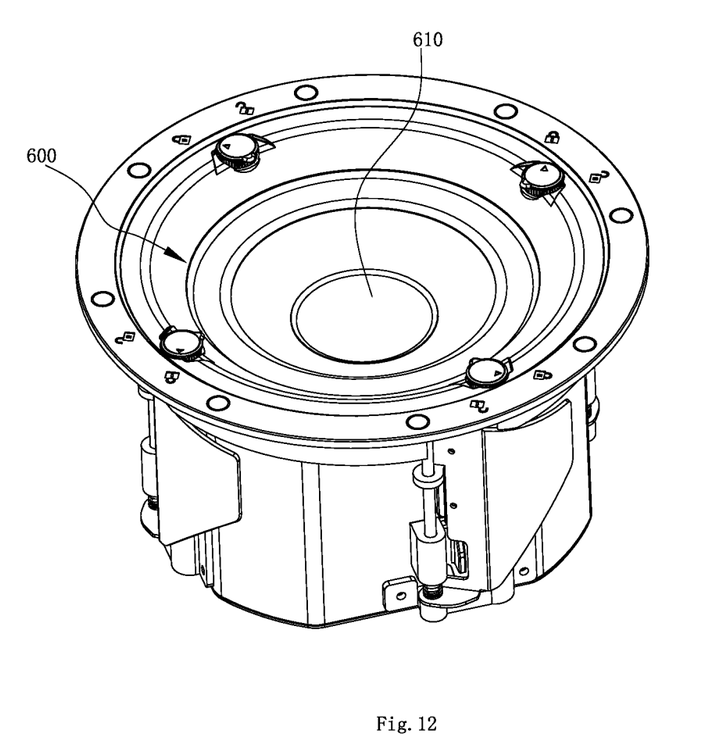
FIG. 12 is a perspective view of the fixing device combined with the electronic device in the present invention.

In another embodiment of the present invention, as shown in FIG. 12 and FIG. 13, an electronic device 600 with the fixing device 100 is also provided. Because of the fixing device 100, the electronic device 600 also has the advantages of simple operation, convenient, fast, fixed and stable, and has the advantages of high practicability when the electronic equipment is fixed.

The electronic device 600 includes a main body 610 mounted on the mounting cylinder 200. As shown in FIG. 5, the central part of the mounting cylinder 200 is provided with an installing slot 250, and the main body 610 is arranged in the installing slot 250. The installing method of the main body 610 and the installing slot 250 can be clamped connection, screw connection, bonding connection or welding connection. The invention does not specifically limit it.

In this embodiment, the electronic device 600 is a loud-speakers. It should be noted that the electronic device 600 is not limited to loudspeakers, but may also be on-board sound, on-board power amplifiers, chandeliers or other electronic devices. Of course, the fixing device 100 in the present invention can also fix the non-electronic device, as long as it is installed in the mounting cylinder 200 according to the practical application.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. A fixing device, used for installing electronic devices on a plate, wherein comprising a mounting cylinder and a fixing plate arranged around a top of said mounting cylinder; said electronic device is mounted in said mounting cylinder, said mounting cylinder and said fixing plate are respectively provided with a plurality of pairs of clamping assemblies and pressing assemblies; said fixing device clamps said plate between said fixing plate and said clamping assemblies, thereby installing said electronic devices on said plate;

each of said pressing assemblies is connected with each of said clamping assemblies in a transmission way; each of said clamping assemblies includes a first shaft and a fan blade pivoted on said first shaft; said plate is clamped between said fixing plate and a top of said fan blade; each of said pressing assemblies pushes or pulls said fan blade to rotate around said first shaft, thereby clamping or releasing said plate;

each of said clamping assemblies also includes a limiting piece, a first elastic piece, a first pushing piece and a torsional spring; said limiting piece is arranged on said mounting cylinder, both ends of said first shaft are mounted at said top of said mounting cylinder and on said limiting piece, respectively; said first pushing piece is sleeved on said first shaft; a side, closed to said mounting cylinder, of said fan blade, is provided with a second inclined block, and said first pushing piece contacts said second inclined block; said first elastic piece is arranged on said limiting piece and is elastically contact with said first pushing piece; said torsional spring are arranged at a top of said first shaft, with one end of said torsional spring against said mounting cylinder, the other end of said torsional spring against said fan blade.

2. The fixing device according to claim 1, wherein each of said clamping assemblies includes a second shaft and a second pushing piece; both ends of said second shaft are movably mounted on said top of said mounting cylinder and on said limiting piece, respectively; said second pushing piece is fixed in an upper part of said second shaft and connected with said first pushing piece; said second shaft is pressed down by manpower, and said second pushing piece is moved downwards to push said first pushing piece, thus said fan blade to rotate around said first shaft with said second inclined block so that said second inclined block is staggered with said first pushing piece, and said first pushing piece is rose under an action of said first elastic piece and simultaneously drives said fan blade to rotate around said first shaft, so as to open said fan blade.

3. The fixing device according to claim 2, wherein one end of said second pushing piece is provided with a second connecting portion, and said mounting cylinder is also provided with a limiting slot; said second connecting portion is sleeved on said second shaft and located in said limiting slot; said second connecting portion extends in a direction away from said limiting slot to form a pushing portion, and a side, closed to said fan blade, of said pushing portion is provided with a first inclined plane; said fan blade is provided with a third inclined block in a direction closed to said first inclined plane; said third inclined block is provided with a second inclined plane matched with said first inclined plane.

4. The fixing device according to claim 3, wherein said first pushing piece is provided with a first inclined block matched with said second inclined block; an upper end of said first inclined block is provided with a first contacting surface; a side, away from said mounting cylinder, of said first inclined block is provided with a third inclined plane; a lower end of said second inclined block is provided with a second contacting surface matched with said first contacting surface; a side, closed to said mounting cylinder, of said second inclined block, is provided with a fourth inclined plane matched with said third inclined plane.

5. The fixing device according to claim 4, wherein each of said pressing assemblies also includes a third pushing block fixedly sleeved on said second shaft; said second shaft is pulled upward to drive said third pushing block to move upward, then said second shaft is rotated to said third pushing block above said first pushing piece, said second shaft is pushed downward, so as to said third pushing block pushes said first pushing piece downward until said fan blade rotates around said first shaft to said first pushing piece against said second inclined block.

6. The fixing device according to claim 4, wherein said fan blade includes a clamping block and fan leaves, said fan leaves are fixed with said clamping block, a side of said clamping block is provided with a first connecting portion, and said first connecting portion is rotatively connected to said first shaft; both ends of said fan leaves are provided with a first sleeved blocks and a second sleeved blocks, respectively, which are sleeved on both ends of said first shaft, respectively.

7. The fixing device according to claim 3, wherein each of said pressing assemblies also includes a third pushing block fixedly sleeved on said second shaft; said second shaft is pulled upward to drive said third pushing block to move upward, then said second shaft is rotated to said third pushing block above said first pushing piece, said second shaft is pushed downward, so as to said third pushing block pushes said first pushing piece downward until said fan blade rotates around said first shaft to said first pushing piece against said second inclined block.

8. The fixing device according to claim 3, wherein said fan blade includes a clamping block and fan leaves, said fan leaves are fixed with said clamping block, a side of said clamping block is provided with a first connecting portion, and said first connecting portion is rotatively connected to said first shaft; both ends of said fan leaves are provided with a first sleeved blocks and a second sleeved blocks, respectively, which are sleeved on both ends of said first shaft, respectively.

9. The fixing device according to claim 2, wherein each of said pressing assemblies also includes a third pushing block fixedly sleeved on said second shaft; said second shaft is pulled upward to drive said third pushing block to move upward, then said second shaft is rotated to said third pushing block above said first pushing piece, said second shaft is pushed downward, so as to said third pushing block pushes said first pushing piece downward until said fan blade rotates around said first shaft to said first pushing piece against said second inclined block.

10. The fixing device according to claim 2, wherein said fan blade includes a clamping block and fan leaves, said fan leaves are fixed with said clamping block, a side of said clamping block is provided with a first connecting portion, and said first connecting portion is rotatively connected to said first shaft; both ends of said fan leaves are provided with a first sleeved blocks and a second sleeved blocks, respectively, which are sleeved on both ends of said first shaft, respectively.

11. The fixing device according to claim 1, wherein said fan blade includes a clamping block and fan leaves, said fan leaves are fixed with said clamping block, a side of said clamping block is provided with a first connecting portion, and said first connecting portion is rotatively connected to said first shaft; both ends of said fan leaves are provided with a first sleeved blocks and a second sleeved blocks, respectively, which are sleeved on both ends of said first shaft, respectively.

12. The fixing device according to claim 11, wherein its upper portion of said mounting cylinder is also provided with an inner groove, and said first sleeved block are accommodated in said inner groove; after said fan blade is rotated, a clamping space is formed between said top of said fan blade and said fixing plate, thereby clamping said plate at the clamping space.

13. The fixing device according to claim 1, wherein said fan blade includes a clamping block and fan leaves, said fan leaves are fixed with said clamping block, a side of said clamping block is provided with a first connecting portion, and said first connecting portion is rotatively connected to said first shaft; both ends of said fan leaves are provided with a first sleeved blocks and a second sleeved blocks, respectively, which are sleeved on both ends of said first shaft, respectively.

14. The electronic device with a fixing device, wherein said fixing device comprises a mounting cylinder and a fixing plate arranged around a top of said mounting cylinder; an electronic device is mounted in said mounting cylinder, said mounting cylinder and said fixing plate are respectively provided with a plurality of pairs of clamping assemblies and pressing assemblies, respectively; said fixing device clamps a plate between said fixing plate and said clamping assemblies, thereby installing said electronic devices on said plate;

each of said pressing assemblies is connected with each of said clamping assemblies in a transmission way; each of said clamping assemblies includes a first shaft and a fan blade pivoted on said first shaft; said plate is clamped between said fixing plate and a top of said fan blade; each of said pressing assemblies pushes or pulls said fan blade to rotate around said first shaft, thereby clamping or releasing said plate;

each of said clamping assemblies also includes a limiting piece, a first elastic piece, a first pushing piece and a torsional spring; said limiting piece is arranged on said mounting cylinder, both ends of said first shaft are mounted at said top of said mounting cylinder and on said limiting piece, respectively; said first pushing piece is sleeved on said first shaft; a side, closed to said mounting cylinder, of said fan blade, is provided with a second inclined block, and said first pushing piece contacts said second inclined block; said first elastic piece is arranged on said limiting piece and is elastically contact with said first pushing piece; said torsional spring are arranged at a top of said first shaft, with one end of said torsional spring against said mounting cylinder, the other end of said torsional spring against said fan blade.

* * * * *